United States Patent
Ikeda et al.

(10) Patent No.: US 9,415,934 B2
(45) Date of Patent: Aug. 16, 2016

(54) TRANSPORT SYSTEM AND TRANSPORT METHOD

(71) Applicant: MURATA MACHINERY, LTD., Kyoto-shi, Kyoto (JP)

(72) Inventors: Masahiro Ikeda, North Salt Lake, UT (US); Masazumi Fukushima, Inuyama (JP); Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 439 days.

(21) Appl. No.: 14/277,111

(22) Filed: May 14, 2014

(65) Prior Publication Data

US 2015/0332948 A1 Nov. 19, 2015

(51) Int. Cl.
G06F 7/00 (2006.01)
B65G 1/04 (2006.01)
B66C 19/00 (2006.01)
H01L 21/677 (2006.01)
B65G 37/02 (2006.01)
H01L 21/67 (2006.01)

(52) U.S. Cl.
CPC .............. B65G 1/0464 (2013.01); B65G 37/02 (2013.01); B66C 19/00 (2013.01); H01L 21/6773 (2013.01); H01L 21/67276 (2013.01); H01L 21/67733 (2013.01); H01L 21/67736 (2013.01); H01L 21/67766 (2013.01); H01L 21/67769 (2013.01); B65G 2201/0297 (2013.01)

(58) Field of Classification Search
None
See application file for complete search history.

(56) References Cited

U.S. PATENT DOCUMENTS

| 6,654,662 B1 | 11/2003 | Hognaland |
| 2007/0010909 A1* | 1/2007 | Bonora ............. H01L 21/67769 700/228 |
| 2011/0245964 A1* | 10/2011 | Sullivan .............. H01L 21/6773 700/228 |
| 2012/0275886 A1* | 11/2012 | Ota .................... H01L 21/67733 414/222.08 |

FOREIGN PATENT DOCUMENTS

| JP | 4025374 B2 | 12/2007 |
| JP | 2012111635 A | 6/2012 |

* cited by examiner

Primary Examiner — Yolanda Cumbess
(74) Attorney, Agent, or Firm — Keating & Bennett, LLP

(57) ABSTRACT

In a transport system, overhead travelling vehicles each including a hoist travel along an overhead travelling vehicle travelling route. A local vehicle travelling route is disposed under the overhead travelling vehicle travelling route and over load ports at a position higher than the load ports. Local vehicles each including hoist travel along the local vehicle travelling route. Buffers are disposed along the local vehicle travelling route. The local vehicle travelling route includes a plurality of local vehicle travelling routes that are provided in parallel, and the local vehicles are configured to diverge and merge from one local vehicle travelling route to another local vehicle travelling route. The local vehicles transport articles between a load port and a buffer under control of a controller. The overhead travelling vehicles, under control of the controller, transfer articles to and from a load port or a buffer and transport articles between a load port or a buffer and a section other than the local vehicle travelling routes.

6 Claims, 7 Drawing Sheets

F I G. 4
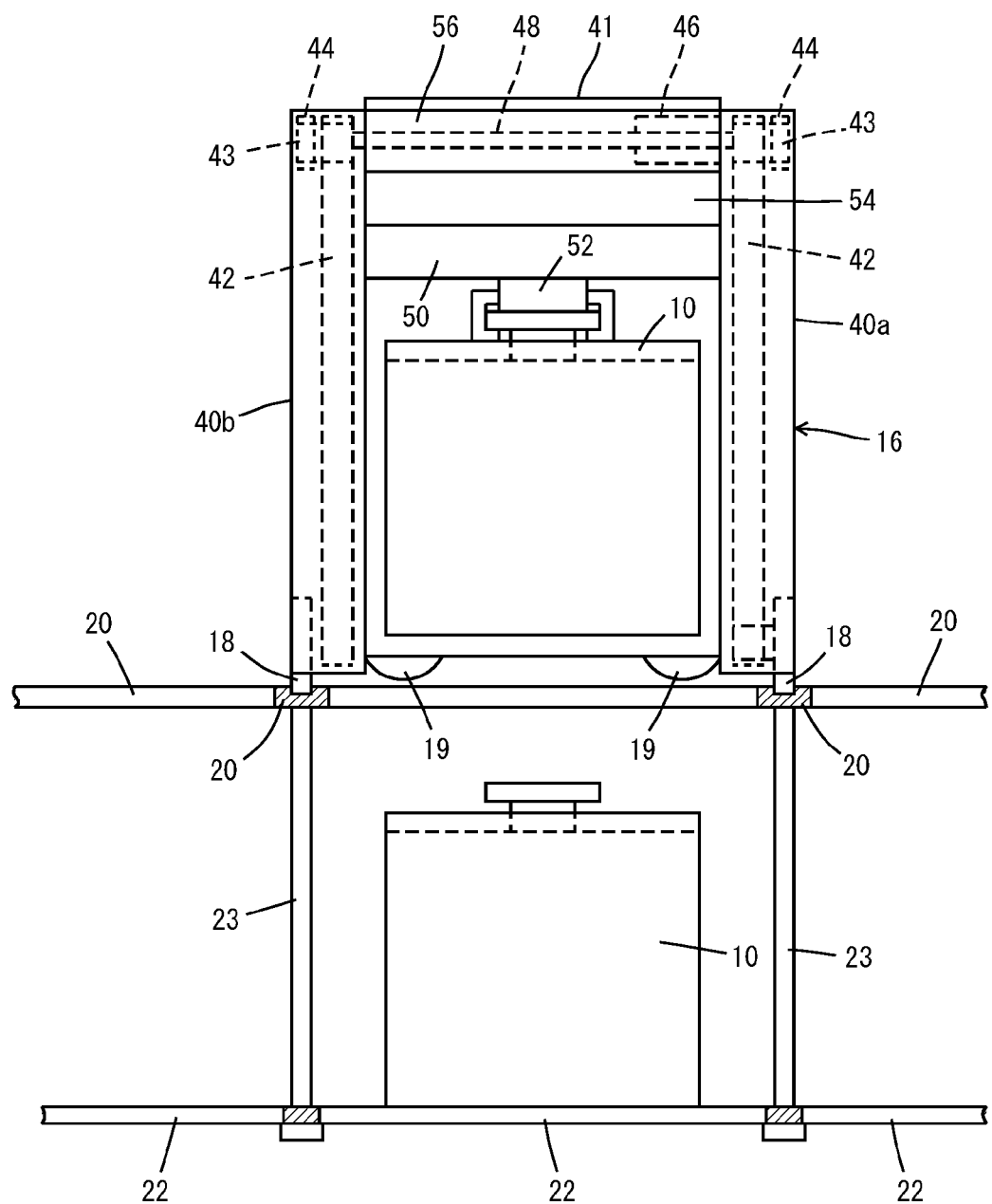

F I G. 5
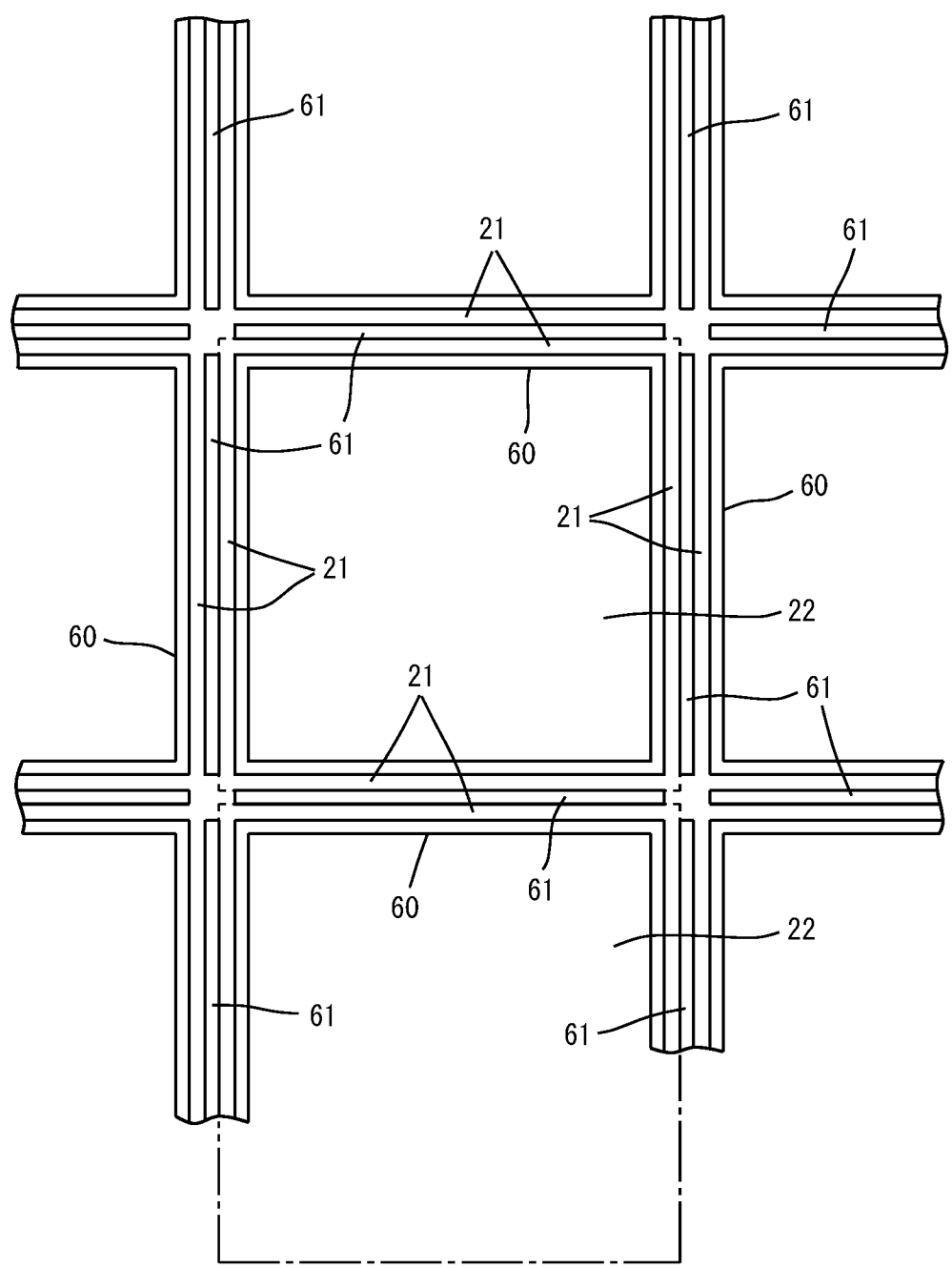

TRANSPORT SYSTEM AND TRANSPORT METHOD

BACKGROUND OF THE INVENTION

1. Field of the Invention

The present invention relates to a transport system that uses overhead travelling vehicles and local tracks, and a transport method.

2. Description of the Related Art

Overhead travelling vehicles are used in semiconductor manufacturing plants and the like in order to transport articles between load ports. It has been proposed to increase the buffer capacity of a transport system to temporarily store articles, and to eliminate the need for an overhead travelling vehicle to wait when a load port is occupied. For example, according to JP 2012-111635A, a local vehicle track and a buffer are provided below a travelling route for an overhead travelling vehicle such that the local vehicle track and the buffer overlap the travelling route for the overhead travelling vehicle. If a load port is occupied, the overhead travelling vehicle can drop off an article onto the buffer instead of the load port.

According to JP 4025374B, with regard to a warehouse in which articles are stacked flat, pallets are stacked one on top of another during storage. The pallets are transported by a vehicle equipped with a hoist travelling longitudinally and transversely above the pallets. This configuration can have a higher capacity to transport the pallets as compared with a gantry crane.

The method disclosed in JP 2012-111635A uses basically one local vehicle and a limited number of buffers. Here, simply increasing the number of local vehicles results in an increase in the frequency of occurrence of a situation in which a local vehicle is blocked by another local vehicle and cannot reach its destination.

SUMMARY OF THE INVENTION

Preferred embodiments of the present invention enable articles to be flexibly transported between load ports and buffers by providing a large number of buffers and enabling each of a plurality of local vehicles to travel to its destinations while detouring around the other local vehicles.

A transport system according to a preferred embodiment of the present invention is a transport system in which overhead travelling vehicles transport articles between load ports provided in individual pieces of processing equipment. The transport system includes an overhead travelling vehicle travelling route; a plurality of overhead travelling vehicles each including a hoist; a local vehicle travelling route that is disposed at least under the overhead travelling vehicle travelling route and over a plurality of load ports at a position higher than the load ports; a plurality of local vehicles travelling along the local vehicle travelling route, the local vehicles each including a hoist; a plurality of buffers that are provided along the local vehicle travelling route and configured to store articles; and a controller configured and programmed to control the overhead travelling vehicles and the local vehicles, wherein the local vehicle travelling route includes a plurality of local vehicle travelling routes that are provided in parallel, and the local vehicles are configured to diverge and merge from one local vehicle travelling route to another local vehicle travelling route, the local vehicles are configured to transport articles between load ports and buffers under control of the controller; and the overhead travelling vehicles are configured to, under control of the controller, transfer articles to and from load ports or buffers and transport articles between load ports or buffers and a section other than the local vehicle travelling routes.

A transport method according to another preferred embodiment of the present invention is a method for transporting articles between load ports that are provided in individual pieces of processing equipment using overhead travelling vehicles. This transport method according to the present preferred embodiment of the present invention includes preparing an overhead travelling vehicle travelling route, a plurality of overhead travelling vehicles each including a hoist, a local vehicle travelling route disposed at least under the overhead travelling vehicle travelling route and over a plurality of load ports at a position higher than the load ports, a plurality of local vehicles travelling along the local vehicle travelling route, the local vehicles each including a hoist, a plurality of buffers that are provided along the local vehicle travelling route and configured to store articles, and a controller that is configured and programmed to control the overhead travelling vehicles and the local vehicles, wherein the local vehicle travelling route includes a plurality of local vehicle travelling routes that are provided in parallel, and the local vehicles are configured to diverge and merge from one local vehicle travelling route to another local vehicle travelling route; transporting articles between load ports and buffers using the local vehicles under control of the controller; and transferring articles to and from load ports or buffers and transporting articles between load ports or buffers to a section other than the local vehicle travelling routes using the overhead travelling vehicles under control of the controller.

When the overhead travelling vehicle travelling route lies over the load ports, a local vehicle travelling route that overlaps this overhead travelling vehicle travelling route in a plan view and a local vehicle travelling route that is parallel to that local vehicle travelling route are provided. In this specification, a description related to the transport system is directly applicable to the transport method, and vice versa.

According to various preferred embodiments of the present invention, since a plurality of local vehicle travelling routes are provided, a large number of buffers are also provided. Also, since a plurality of local vehicles are provided, a high transport capacity is achieved. Also, since the local vehicles are configured to diverge and merge from one of the plurality of travelling routes to another, each local vehicle is configured to detour around the other local vehicles and reach the destination. Accordingly, a high buffer capacity and a high transport capacity are achieved, and also a target load port is readily reached. Thus, articles are quickly transported in response to a request, for example, an article that needs to be transported preferentially is quickly transported, and an article with respect to which arrival time is specified is transported such that the article arrives at the specified arrival time.

It is preferable that the local vehicle travelling routes include a plurality of local tracks that are arranged with a space interposed therebetween, the local vehicles are configured to travel while being guided by the plurality of tracks, and the buffers are disposed under the space between the tracks. With this configuration, since the local vehicles are guided by the plurality of tracks, the local vehicles travel stably, and since the buffers are disposed under the space between the tracks, articles are transferred without a lateral movement.

It is preferable that a plurality of tracks extending in a first direction are provided, the tracks being arranged with a space interposed therebetween, a plurality of tracks extending in a second direction that is perpendicular to the first direction are provided, the tracks being arranged with a space interposed therebetween, and the local vehicles each include a first running portion configured to travel along the first direction, a second running portion configured to travel along the second direction, and a switching portion configured to selectively operating one of the first and second running portions, and travel longitudinally and transversely in the first and second directions.

The local vehicles travel longitudinally and transversely in the first and second directions by switching between the first and second running portions. Also, the local vehicles change the travelling direction at each intersection of the tracks. Accordingly, each local vehicle readily travels to the destination while detouring around the other local vehicles and the like. The provision of a large number of tracks extending in the first direction and a large number of tracks extending in the second direction makes it possible to provide a larger number of buffers and to increase the number of travelling paths for the local vehicles.

It is preferable that the tracks are disposed in a range from a position over the load ports to a position over the processing equipment and arranged in a grid pattern so as to extend in the first and second directions, the buffers are disposed under cells of the grid, the cells being surrounded by the tracks extending in the first direction and the tracks extending in the second direction, and the local vehicles are configured to travel to any cell of the grid. With this configuration, a large number of buffers are provided, and furthermore, each local vehicle is configured to travel to the destination along the tracks that are arranged in the grid pattern while detouring around the other local vehicles and the like.

It is preferable that the overhead travelling vehicle travelling route diverges upstream of a portion over the local vehicle travelling route so as to be double-tracked, and merges downstream of the portion over the local vehicle travelling route so as to be single-tracked, and, furthermore, a buffer to and from which both the overhead travelling vehicles and the local vehicles are configured to transfer articles are provided under the double-tracked travelling route. Since the overhead travelling vehicle travelling route is double-tracked, jamming that is caused by the overhead travelling vehicles stopping and transferring articles is significantly reduced or prevented.

It is preferable that the double-tracked travelling route is disposed in a position over the load ports and a position over the processing equipment or a position over a rear side of the processing equipment, and the local vehicle travelling routes are disposed in a range from the position over the load ports to the position over the processing equipment or the position over the rear side of the processing equipment. With this configuration, the overhead travelling vehicles both access a load port directly and access a buffer by travelling along a route that avoids the load port. Also, a large number of local vehicle travelling routes and a large number of buffers are provided.

It is preferable that the local vehicles each include a turntable that rotates an article about a vertical axis. The turntable may also rotate the hoist, or may be lifted and lowered by the hoist. Also, although it is sufficient if the turntable preferably is configured to rotate an article by at least 180°, it is preferable that the turntable is capable of rotation by three types of angles of rotation, that is, preferably 90°, 180°, and 270°, for example, and is capable of performing a minute correction of the angle of rotation. The provision of the turntable makes it possible to rotate the articles so as to be fit for the orientation of the individual load ports.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a partially cut-away front view of a local vehicle, local tracks, and buffers according to a preferred embodiment of the present invention.

FIG. 5 is a plan view of local tracks according to a variation of a preferred embodiment of the present invention.

DETAILED DESCRIPTION OF THE PREFERRED EMBODIMENTS

The following describes preferred embodiments of the present invention. The scope of the present invention is based on the claims, and is intended to be determined in accordance with the understanding of a person skilled in the art with reference to the description of the specification and related art in the field of the present invention.

Figure 6:
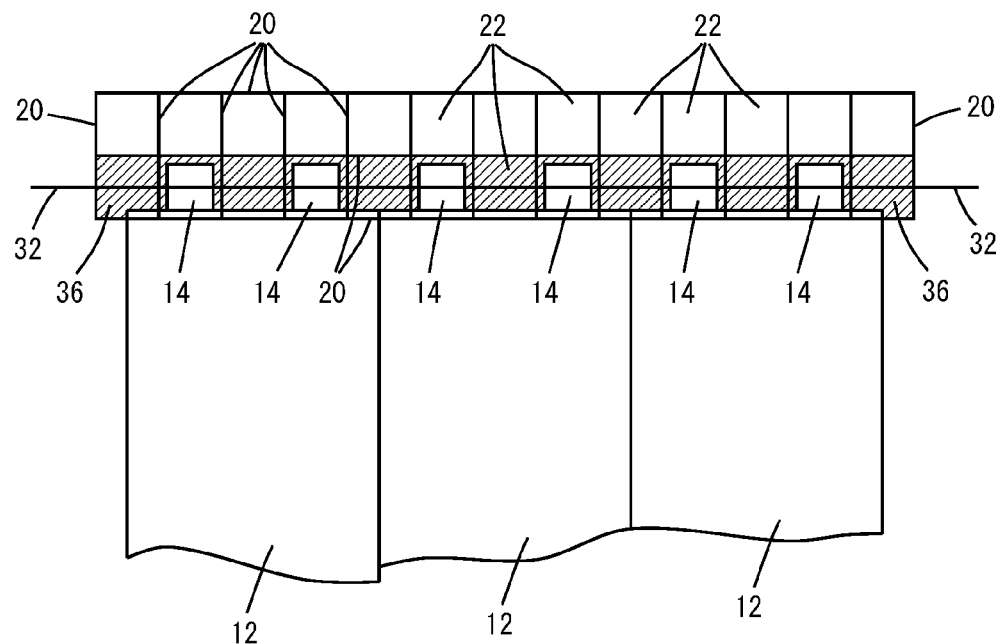
FIG. 6 is a plan view of relevant portions of a transport system according to a variation of a preferred embodiment of the present invention.
Figure 7:
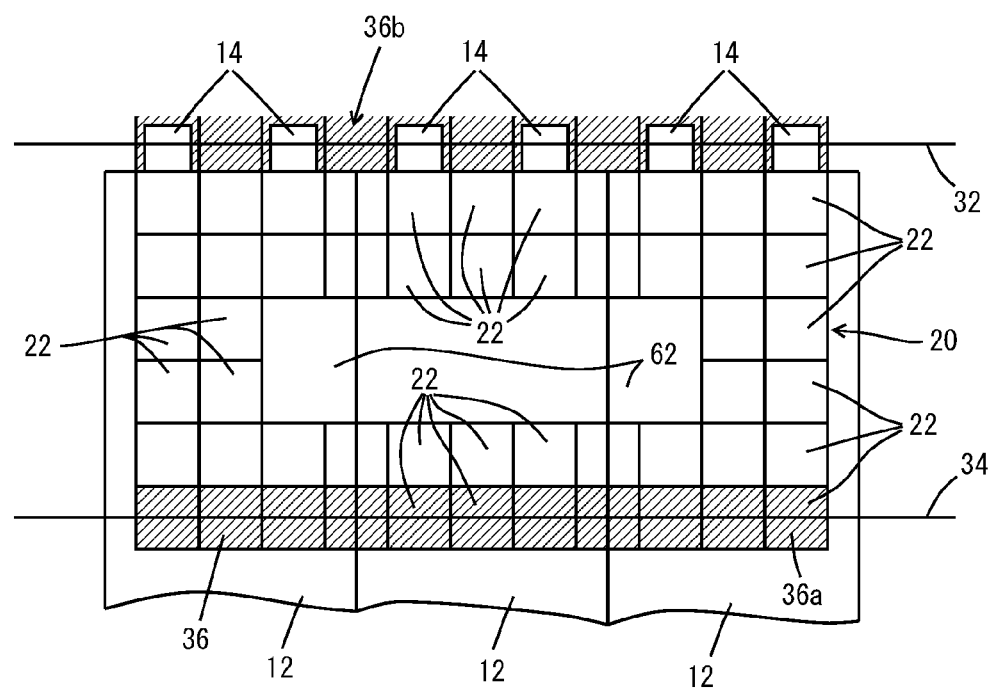
FIG. 7 is a plan view of relevant portions of a transport system according to a second variation of a preferred embodiment of the present invention.

FIGS. 1 to 8 show a transport system 2 according to a preferred embodiment of the present invention (FIGS. 1 to 4 and 8) and variations thereof (FIGS. 5 to 7). The transport system 2 may be installed in a clean room or the like at a semiconductor fabrication plant. Overhead travelling vehicles (OHTs) 4 travel along travelling tracks 6 of inter-bay and intra-bay routes that are installed in a ceiling space of the clean room. The travelling tracks 6 are supported from a ceiling 25 by struts 7. The intra-bay routes refer to the routes that are disposed within individual bays in which processing equipment 12 configured to process semiconductors or the like is located. The intra-bay routes are connected to one another by the inter-bay route. The overhead travelling vehicles 4 each include a hoist and a mechanism configured to laterally move the hoist (both are not shown), and transfer articles 10 such as FOUPs to and from load ports 14 by lifting and lowering an elevation platform 8 using the hoist.

The function of the overhead travelling vehicles 4 according to the present preferred embodiment is to quickly transport the articles 10 between load ports 14 that are located in different intra-bay routes. The overhead travelling vehicles 4 stop to transfer the articles 10 to and from the load ports 14, and this stopping may cause jamming in the intra-bay routes. To address this issue, the opportunity of the overhead travelling vehicles 4 delivering articles to and removing articles from buffers rather than the load ports 14 is increased so as to significantly reduce or prevent jamming. In association with this, transport from the load ports 14 to the buffers and from the buffers to the load ports 14 is performed by the local vehicles, and preferably, the proportion of the transport that is performed by the local vehicles within individual bays is increased. For this purpose, the number of local vehicles is increased to enhance the transport capacity, and the local vehicles are enabled to flexibly choose a travelling path so that the local vehicles are prevented from jamming.

Reference numeral 16 denotes local vehicles. Local tracks 20 are provided in individual bays such that the local tracks 20 extend from a position over a load port 14 to a position over a piece of processing equipment 12, a position over a rear side of the processing equipment 12, or the like. The local tracks 20 are arranged longitudinally and transversely in a grid pattern, for example, and are supported from the ceiling 25 by struts 24, for example. However, the local tracks 20 may also be supported by the floor surface or the like of the clean room. Also, buffers 22 are provided below the local tracks 20 in a grid pattern, for example, and are supported from the local tracks 20 by struts 23, for example. The local vehicles 16 transport the articles 10 from the buffers 22 to the load ports 14 and from the load ports 14 to the buffers 22.

Figure 1:
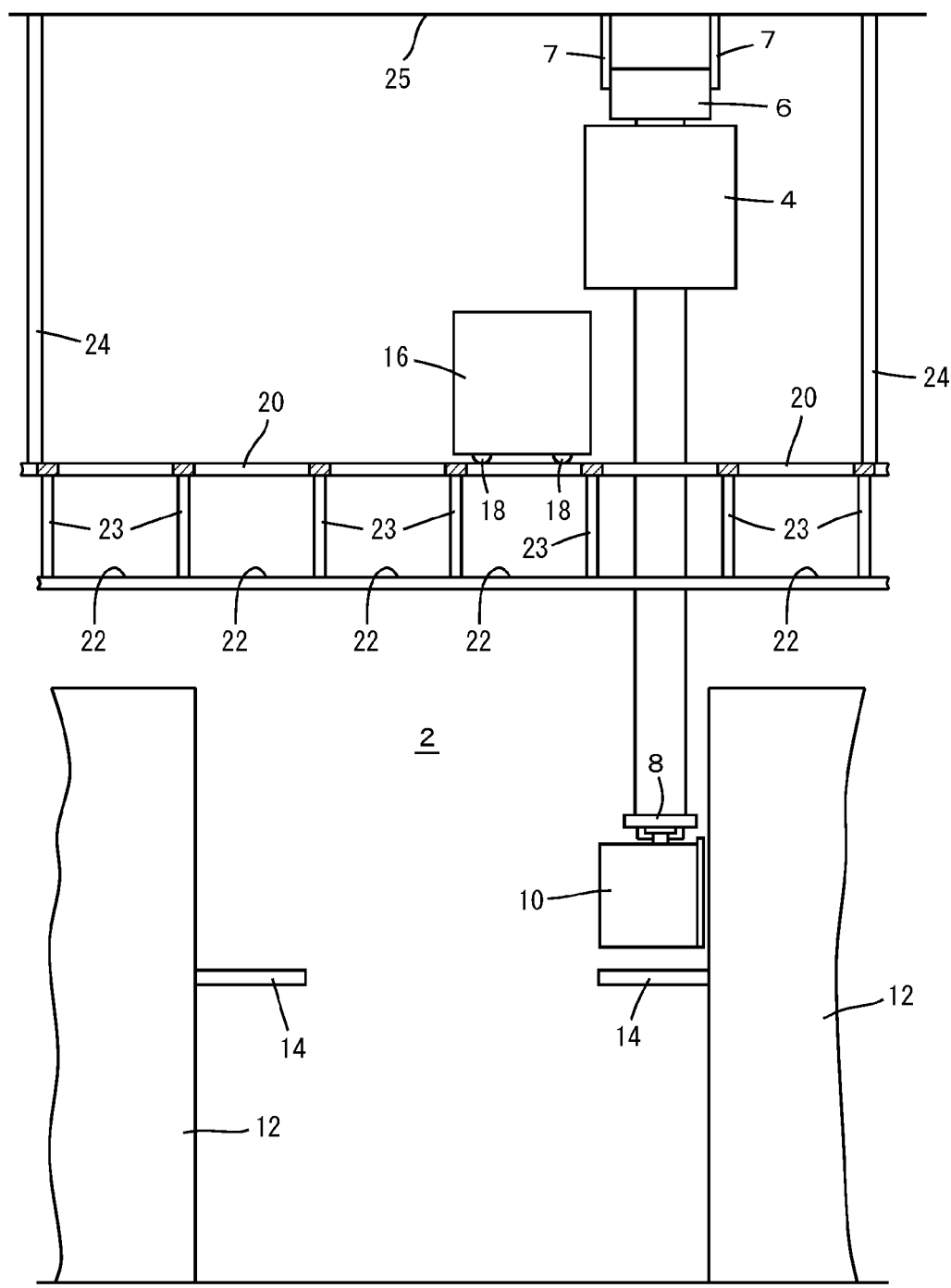
FIG. 1 is a front view of relevant portions of a transport system according to a preferred embodiment of the present invention.
Figure 2:
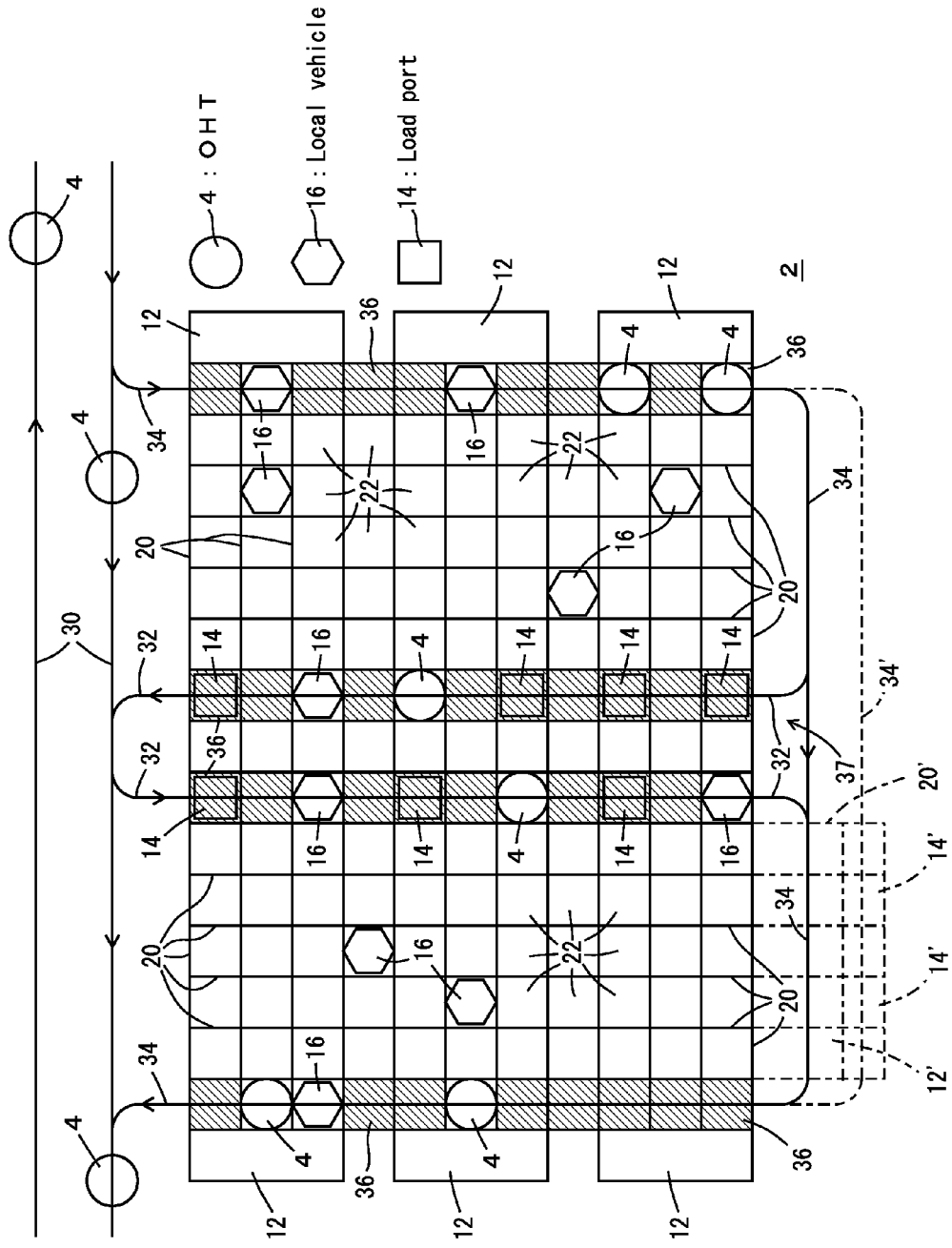
FIG. 2 is a plan view of relevant portions of the transport system according to a preferred embodiment of the present invention.

FIG. 2 shows an example of the arrangement of the local tracks 20. An intra-bay route 32 and an additional route 34 are extended from an inter-bay route 30 into a bay. The additional route 34 is the route that is added on to the ordinary intra-bay route 32 passing over the load ports 14, and passes over the processing equipment 12 or over the rear side of the processing equipment 12. The local tracks 20 are disposed, for example, over the processing equipment 12 and arranged in a grid pattern, and, for example, one or more buffers 22 are provided for each single cell of the grid. That is to say, the buffers 22 are provided in individual spaces in the local tracks 20, which are arranged in the grid pattern, that are surrounded by the tracks. Also, areas that can be accessed by both the local vehicles 16 and the overhead travelling vehicles 4 are referred to as transfer areas 36, and the load ports 14 and the buffers 22 are provided in the transfer areas 36. In FIG. 2, the local tracks 20 are also provided over a passageway 37 between left and right rows of the pieces of processing equipment 12 so that transport within the bay is performed using only the local vehicles 16. However, a configuration is also possible in which the local tracks 20 to the left of the bay and the local tracks 20 to the right of the bay are unconnected. Note that as indicated by chain lines in a lower portion of FIG. 2, if a piece of processing equipment 12' and load ports 14' are disposed, it is preferable to add local tracks 20', which are indicated by the chain lines, for the processing equipment 12' and the load ports 14' accordingly. In this case, the orientation of the load ports 14' has been changed by 90° or 270° from that of the other load ports 14. Therefore, it is preferable to enable the orientation of articles to be rotated by 90°, 180°, and 270° by a turntable that is included in each local vehicle 16. Furthermore, in order to compensate for a minute deviation in the orientation of the load ports 14 and 14' and the like, it is preferable to enable a minor correction of the angle of rotation of the turntables to be performed.

Figure 3:
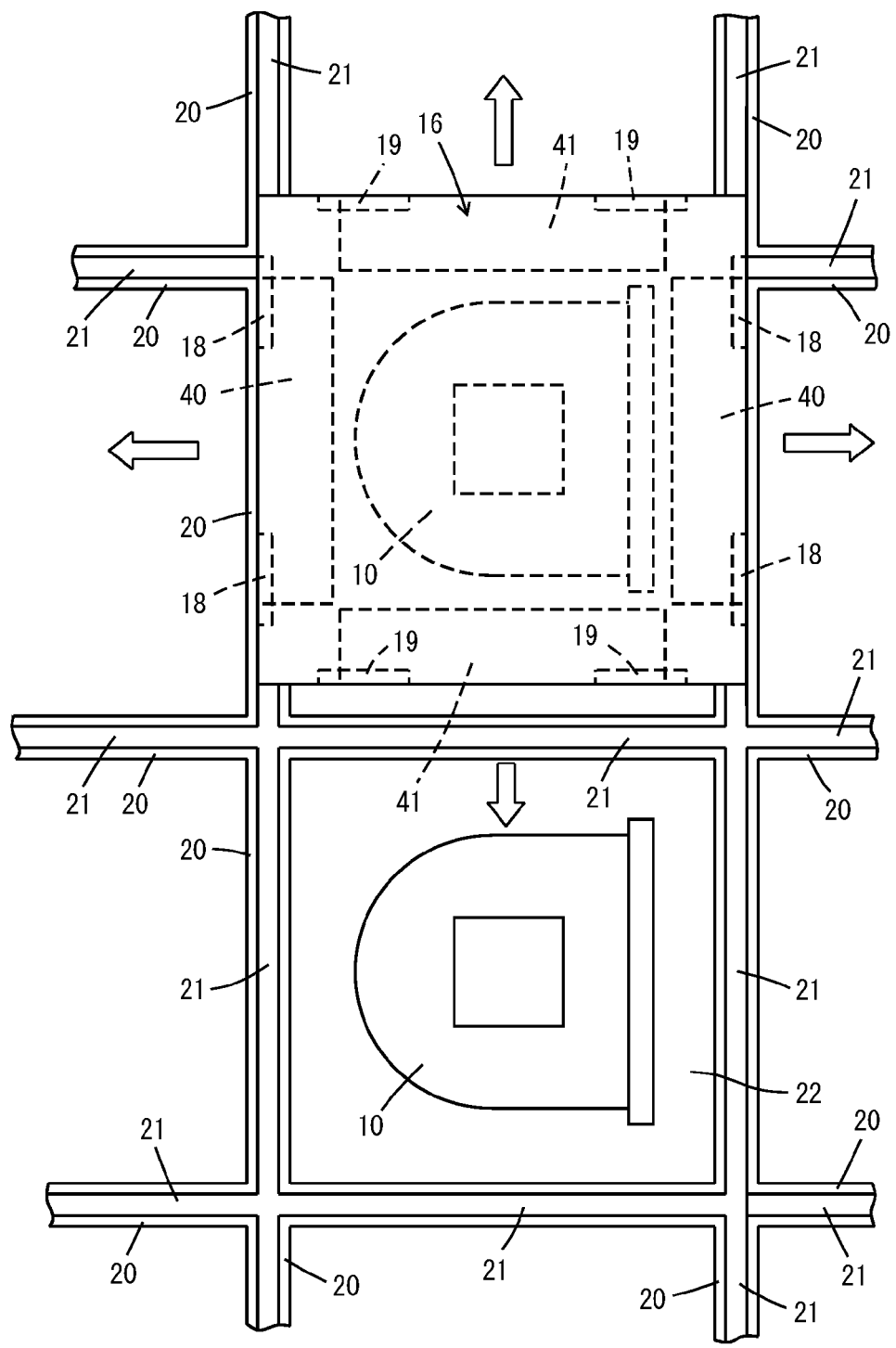
FIG. 3 is a plan view of a local vehicle, local tracks, and a buffer according to a preferred embodiment of the present invention.

FIG. 3 shows the local tracks 20 and a local vehicle 16. Grooves 21 are provided in the middle of the local tracks 20 with respect to a width direction. The local vehicle 16 includes, for example, two pairs of front and rear wheels 18 and, for example, two pairs of front and rear wheels 19, and the wheels 18 run in a direction that is perpendicular to the running direction of the wheels 19. The wheels 18 are rotated by running portions 40. The wheels 19 are rotated by running portions 41. Either the wheels 18 or the wheels 19 are lowered while the other wheels are lifted, and the lowered wheels are caused to run while being guided by the grooves 21. In this manner, the local vehicle 16 travels guided by a pair of local tracks 20, and thus move from an arbitrary position to another arbitrary position on the local tracks 20 that are arranged in a grid pattern. During this movement, the local vehicle 16 is configured not only to travel longitudinally and transversely but also to move forward and backward.

FIG. 4 shows the structure of the local vehicles 16. In a running portion 40a, the wheels 18 are rotated by a belt 42, and the belt 42 is driven by a motor 46 via a gear 43 and a belt 44. Also, the output of the motor 46 is transmitted to a running portion 40b by a drive shaft 48. The running portion 41 also preferably has the same structure. Reference numeral 50 denotes a hoist, which lifts and lowers an elevation platform 52 that grips an article 10, thus performing transfer of the article 10 to and from the load ports 14 and the buffers 22. A turntable 54 rotates the hoist 50 in increments of, for example, 90°, thereby rotating the article 10 to an orientation that is fit for the load ports 14. A switching portion 56 includes a motor, a cam, and the like, which are not shown, and lowers one of the running portions 40 and 41 so that either the wheels 18 or the wheels 19 are guided by the grooves 21, while lifting the other running portion so that the other wheels are spaced upward from the local tracks 20. Then, the article 10 is drawn into the inside of the local vehicle 16. The provision of the drive shaft 48, the switching portion 56, and the like in positions above the article 10 enables these members to be disposed without interference with the article 10 and enables the dimensions of the local vehicle 16 in a plan view to be reduced.

With the above-described structure, the local vehicle 16 travels from an arbitrary position to another arbitrary position on the local tracks 20 in FIG. 2 and rotates the article 10 to a desired orientation. Also, the space that is needed for the local vehicle 16 preferably is a single cell and eight cells around the single cell of the local track 20, for example. That is to say, the local vehicle 16 freely travels if a gap corresponding to at least a single cell is present between that local vehicle 16 and another local vehicle 16. Thus, the local vehicle 16 freely travels without being blocked by the other local vehicles.

In a variation of a preferred embodiment of the present invention shown in FIG. 5, ridges 61 are provided in the middle of local tracks 60, and a pair of grooves 21 are provided on either side of the individual ridges 61, thus enabling a pair of local vehicles 16 to travel along the same local track 60. Note that chain lines in FIG. 5 indicate the buffers 22. The local tracks can have any structure, and, for example, instead of providing the grooves 21, it is also possible to adopt a structure in which guide rollers provided in the local vehicles 16 are guided by the local tracks. Although the local vehicles 16 travel above the local tracks 20 and 60 in this preferred embodiment, the local vehicles 16 may also travel such that the local vehicles 16 are suspended from the local tracks.

In a variation of a preferred embodiment of the present invention shown in FIG. 6, the arrangement of the local tracks 20 has been downsized. The local tracks 20 in FIG. 6 are configured such that tracks under the intra-bay route 32 and tracks beside those tracks are arranged parallel to each other in a double-track configuration to enable diverging and merging at arbitrary cells. Since the local vehicles are configured to travel along the local tracks 20 longitudinally and transversely as well as forward and backward, even when an overhead travelling vehicle or another local vehicle is transferring an article in a transfer area 36, the local vehicles are configured to detour around that vehicle and reach the destination. Also, the local vehicles are configured to reach a single destination from three sides of that destination (in FIG. 2, from four sides of the destination). In addition, the orientations of the articles are adjusted using the turntables so as to be fit for the load ports 14.

In a variation of a preferred embodiment of the present invention shown in FIG. 7, the additional route 34 is provided over a row of the pieces of processing equipment 12 or over the rear side of the row of the pieces of processing equipment 12, and local tracks 20 are disposed in a range between the intra-bay route 32 and the additional route 34. The overhead travelling vehicles perform transfer of articles in both transfer areas 36a and 36b, and, for example, perform transfer of articles directly with the load ports 14 and also transfer of articles with buffers in the transfer area 36a on the opposite side to the load ports 14. The local vehicles are configured to detour around a position at which an overhead travelling vehicle or another local vehicle is performing transfer and reach the destination. Note that reference numeral 62 denotes spare spaces in which neither local tracks 20 nor buffers 22 are provided, and additional local tracks 20 and buffers 22 may also be added on in these spare spaces.

Figure 8:
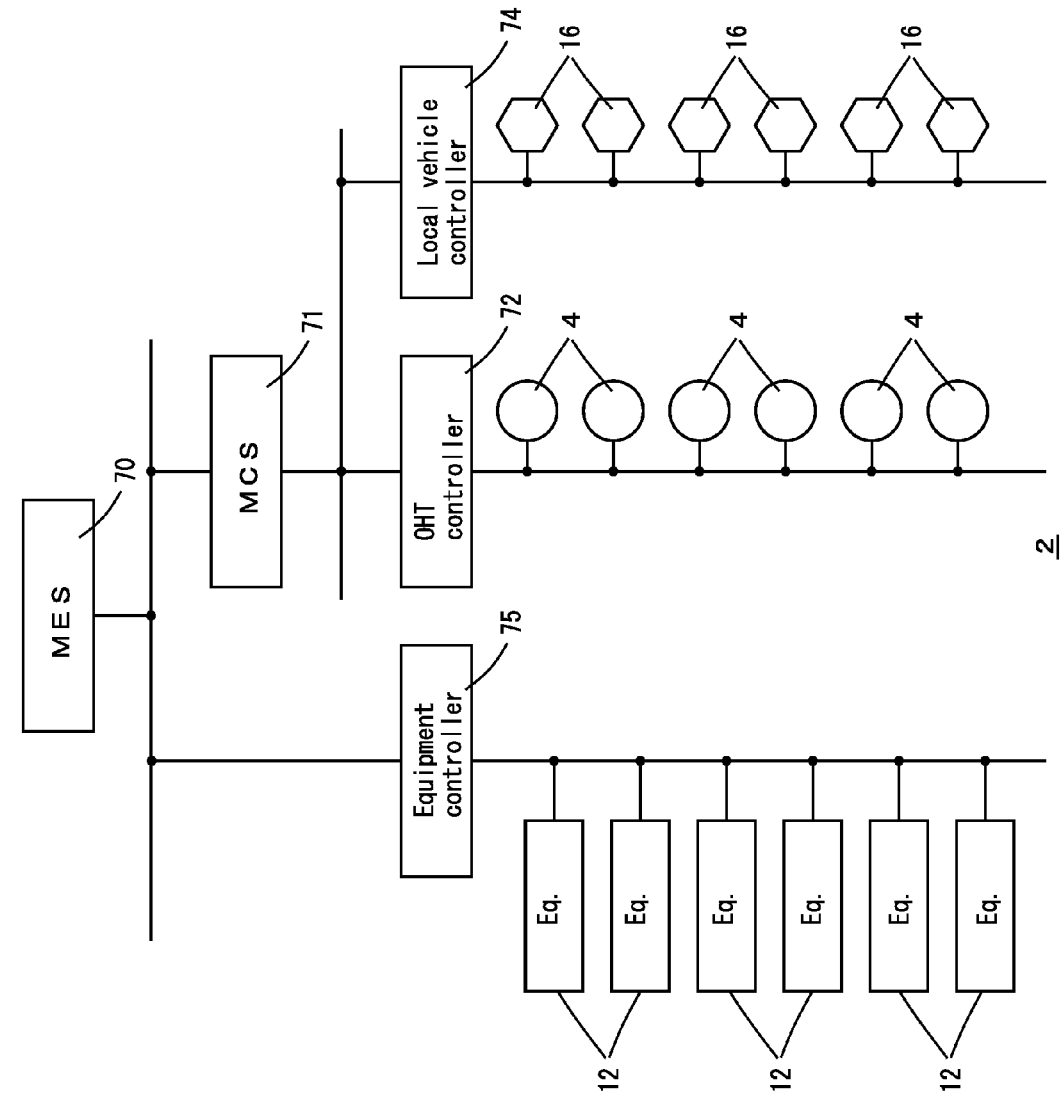
FIG. 8 is a block diagram illustrating a control system according to a preferred embodiment of the present invention.

FIG. 8 shows a control system of the transport system 2. Reference numeral 70 denotes a manufacturing execution system (MES) as the highest-order system, which performs information management of a material control system (MCS) 71 and a processing equipment controller 75 and issues instructions to the processing equipment controller 75 and the material control system 71 based on a semiconductor fabrication schedule. The processing equipment controller 75 is configured and programmed to manage the processing equipment 12 based on the instruction from the manufacturing execution system 70 and report the progress of processing to the manufacturing execution system 70. The material control system 71 creates a schedule to transport the articles 10 based on the semiconductor fabrication schedule received from the manufacturing execution system 70 and cause an overhead travelling vehicle controller (OHT controller) 72 and a local vehicle controller 74 to execute transport of the articles 10. In addition, a stocker controller, which is not shown, may also be provided. Note that the overhead travelling vehicle controller 72 and the local vehicle controller 74 may be configured as a single unit or may be separate units. The overhead travelling vehicles 4 can only travel along the travelling routes in one direction, and, furthermore, the travelling routes may be congested. Thus, it is difficult for the overhead travelling vehicles 4 to transport the articles as instructed. By contrast, the local vehicles 16 travel longitudinally and transversely and freely move forward and backward, and the local tracks are arranged parallel to each other in double-track form. Thus, the local vehicles 16 readily reach the respective destinations.

If jamming or the like occurs, an overhead travelling vehicle 4 changes a drop-off position at which it drops off an article to, for example, a buffer within a transfer area as appropriate, and the overhead travelling vehicle controller 72 notifies the local vehicle controller 74 to that effect. Then, a local vehicle 16 transports the article from the position at which the overhead travelling vehicle has dropped off the article to a target load port. Moreover, if an overhead travelling vehicle 4 stops at a position over a load port and picks up an article therefrom, travelling of the other overhead travelling vehicles is restricted. Furthermore, there are cases where it is difficult for an overhead travelling vehicle to access a target load port due to jamming. By contrast, a local vehicle 16 readily accesses a desired load port and pick up an article therefrom and also can drop off the article onto a buffer that is located at a position where jamming of the overhead travelling vehicles is unlikely to occur. Therefore, removal of articles from load ports is quickly performed.

The local vehicles 16 travel longitudinally and transversely as well as forward and backward, so that a travelling path to the destination is freely chosen.

The local vehicles 16 preferably include the turntables, so that the orientation of articles is changed so as to be fit for the load ports 14.

The provision of the local vehicles 16 and the buffers 22 enables the overhead travelling vehicles 4 to freely change the drop-off position and the pick-up position. In other words, between a position that is convenient for an overhead travelling vehicle 4 and a target load port 14, an article is transported by a local vehicle 16 and stored in a buffer 22.

A large number of buffers 22 preferably are provided, and the local vehicles 16 travel flexibly, so that articles are transported by a large number of local vehicles 16.

The foregoing features make it possible to quickly deliver and remove an article (hot-lot) that needs to be transported urgently to and from a load port 14.

Since a large number of local vehicles 16 are configured to access a desired load port 14, and a large number of buffers 22 are present, delivery of an article to a required load port 14 and removal of an article from a required load port 14 are performed at a point in time that is required by the manufacturing execution system 71.

According to various preferred embodiments of the present invention, the local tracks 20 are arranged in a grid pattern, and the local vehicles 16 travel longitudinally and transversely. However, with a minimum configuration in which local tracks are arranged in a double-track configuration, and the double-tracked local tracks are connected to each other at a diverging portion and a merging portion, the local vehicles that are configured to move forward and backward and to diverge and merge flexibly travel to a target position and perform delivery and removal of an article.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system in which overhead travelling vehicles transport articles between load ports provided in individual pieces of processing equipment, comprising:
    an overhead travelling vehicle travelling route;
    a plurality of overhead travelling vehicles each including a hoist;
    a local vehicle travelling route that is disposed at least under the overhead travelling vehicle travelling route and over a plurality of load ports at a position higher than the load ports;
    a plurality of local vehicles configured to travel along the local vehicle travelling route and each including a hoist;
    a plurality of buffers that are provided along the local vehicle travelling route and configured to store articles; and
    a controller configured and programmed to control the overhead travelling vehicles and the local vehicles; wherein
    the local vehicle travelling route includes a plurality of local vehicle travelling routes that are provided in parallel or substantially in parallel, and the local vehicles are configured to diverge and merge from one local vehicle travelling route to another local vehicle travelling route;
    the local vehicles are configured to transport articles between load ports and buffers under control of the controller;
    the overhead travelling vehicles are configured to, under control of the controller, transfer articles to and from load ports or buffers and transport articles between load ports or buffers and a section other than the local vehicle travelling routes;

the local vehicle travelling routes include a plurality of local tracks that are arranged with a space interposed therebetween;

the local vehicles are configured to travel while being guided by the plurality of tracks;

the buffers are disposed under the space between the tracks;

a plurality of tracks extending in a first direction are provided, the plurality of tracks being arranged with a space interposed therebetween;

a plurality of tracks extending in a second direction that is perpendicular or substantially perpendicular to the first direction are provided, the plurality of tracks being arranged with a space interposed therebetween; and the local vehicles each include a first running portion configured to travel in the first direction, a second running portion configured to travel in the second direction, and a switching portion configured to selectively operate one of the first and second running portions, and are configured to travel longitudinally and transversely in the first and second directions.

2. The transport system according to claim 1, wherein
the tracks are disposed in a range from a position over the load ports to a position over the processing equipment and arranged in a grid pattern so as to extend in the first and second directions; and the buffers are disposed under cells of the grid, the cells being surrounded by the tracks extending in the first direction and the tracks extending in the second direction, and the local vehicles are configured to travel to any of the cell of the grid.

3. The transport system according to claim 1, wherein the local vehicles each include a turntable that rotates an article about a vertical axis.

4. A transport system in which overhead travelling vehicles transport articles between load ports provided in individual pieces of processing equipment, comprising:

an overhead travelling vehicle travelling route;

a plurality of overhead travelling vehicles each including a hoist;

a local vehicle travelling route that is disposed at least under the overhead travelling vehicle travelling route and over a plurality of load ports at a position higher than the load ports;

a plurality of local vehicles configured to travel along the local vehicle travelling route and each including a hoist;

a plurality of buffers that are provided along the local vehicle travelling route and configured to store articles; and a controller configured and programmed to control the overhead travelling vehicles and the local vehicles; wherein the local vehicle travelling route includes a plurality of local vehicle travelling routes that are provided in parallel or substantially in parallel, and the local vehicles are configured to diverge and merge from one local vehicle travelling route to another local vehicle travelling route;

the local vehicles are configured to transport articles between load ports and buffers under control of the controller;

the overhead travelling vehicles are configured to, under control of the controller, transfer articles to and from load ports or buffers and transport articles between load ports or buffers and a section other than the local vehicle travelling routes; and the overhead travelling vehicle travelling route diverges upstream of a portion over the local vehicle travelling route so as to be double-tracked and merges downstream of the portion over the local vehicle travelling route so as to be single-tracked; and a buffer to and from which both the overhead travelling vehicles and the local vehicles are configured to transfer articles is provided under the double-tracked travelling route.

5. The transport system according to claim 4, wherein
the double-tracked travelling route is disposed in a position over the load ports and a position over the processing equipment or a position over a rear side of the processing equipment; and the local vehicle travelling routes are disposed in a range from the position over the load ports to the position over the processing equipment or the position over the rear side of the processing equipment.

6. The transport system according to claim 4, wherein the local vehicles each include a turntable that rotates an article about a vertical axis.

* * * * *